United States Patent [19]

Matthews et al.

[11] Patent Number: 5,071,485
[45] Date of Patent: Dec. 10, 1991

[54] METHOD FOR PHOTORESIST STRIPPING USING REVERSE FLOW

[75] Inventors: John C. Matthews, Gaithersburg; Robert D. Wooten, Rockville, both of Md.; David S. Ferris, Washington, D.C.; Stuart N. Rounds, Germantown, Md.

[73] Assignee: Fusion Systems Corporation, Rockville, Md.

[21] Appl. No.: 580,928

[22] Filed: Sep. 11, 1990

[51] Int. Cl.⁵ .............................................. B08B 5/00
[52] U.S. Cl. ............................... 134/2; 134/19; 134/31; 134/37; 156/640; 156/662; 219/390; 219/405; 219/411
[58] Field of Search ...................... 219/390, 405, 411; 134/19, 2, 31, 37; 156/640, 662

[56] References Cited

U.S. PATENT DOCUMENTS

| | | | |
|---|---|---|---|
| 4,341,592 | 7/1982 | Shortes et al. | 156/643 |
| 4,544,446 | 10/1985 | Cady | 134/33 |
| 4,885,047 | 12/1989 | Ury et al. | 134/34 |

Primary Examiner—Theodore Morris
Assistant Examiner—Zeinab El-Arini
Attorney, Agent, or Firm—Pollock, Vande Sande & Priddy

[57] ABSTRACT

A method and apparatus for stripping a photoresist layer from a semiconductor wafer, wherein oxidizing gas is fed from the edge of the wafer to the center. The oxidizing gas may be directed so that it is incident on the heated wafer support platform before it is incident on the wafer.

4 Claims, 3 Drawing Sheets

METHOD FOR PHOTORESIST STRIPPING USING REVERSE FLOW

The present invention is directed to an improved method and apparatus for photoresist stripping, and particularly, to a method and apparatus which results in rapid stripping times.

In the manufacture of integrated circuits, the technique of photolithography is frequently used. In the practice of this technique, a semiconductor wafer is coated with a photoresist, which is then exposed with ultraviolet radiation which is passed through a mask so that a desired pattern is imaged on the photoresist. This causes changes in the solubility of the exposed areas of the photoresist such that after development in a suitable solvent the desired pattern is fixed on the wafer, whereupon the photoresist may be hardbaked to enable it to withstand subsequent processing.

In such subsequent processing, integrated circuit components which correspond to the desired pattern are formed by processes including plasma etching or ion implantation.

After the integrated circuit components are formed, it is desired to strip the photoresist from the wafer, which at this point has already served its useful purpose. The relative ease or difficulty with which the photoresist may be stripped depends on the degree to which physical and chemical changes have been induced in the resist during the specific plasma etching or ion implantation processes and on the degree to which the resist has been cross-linked. Thus, it is generally known that a significant degree of hard baking and to an even greater extent, the processes of plasma etching and ion implantation induce physical and chemical changes in the photoresist, so that stripping is particularly difficult.

Of further relevance is the fact that when the photoresist solution is initially applied to the wafer, it is done so by a process known as spin coating. In the spin coating procedure the wafer is mounted on a vacuum chuck and a drop of resist is placed in the center of the wafer. The chuck along with the wafer is spun at speeds from several hundred to thousands of RPM. This causes centrifugal force to spread the drop of resist into a thin layer, while cohesion forces in the liquid resist solution cause a thick bead of resist to form at the edge of the wafer.

In cross section this bead tapers down from the edge towards the center of the wafer, and in some cases it may wrap around over the beveled edge of the wafer onto the back thereof. The bead may be up to four times as thick at the wafer edge than the resist is at the center of the wafer.

Additionally, plasma treatment and ion implantation steps which may be performed on a resist coated wafer tend to harden the resist especially at the edge, and ion implantation, especially of phosphorous ions can cause the resist bead to blister. The resist that forms the blister buckles away from the wafer surface and cools, and the cooled resist does not readily oxidize. Although processes are sometimes used to remove the resist bead after the spin coating process is performed, they are usually not fully effective, and are less often effective in removing the bead in the vicinity of the flat on the wafer edge.

Thus, removal of the edge bead is an important consideration in a photoresist stripping, and in fact is a limiting factor in how fast a wafer can be cleared of resist.

In the prior art, the most common techniques which have been used for photoresist stripping are the use of wet solvent developers such as sulfuric acid-hydrogen peroxide solution, and the technique of plasma ashing. However, these have not proven to be altogether satisfactory, as wet solvent developers are difficult and dangerous to work with and have tended to result in surface contamination, while plasma ashing has characteristically been too slow and has sometimes resulted in electrical damage to the wafer.

A further technique for photoresist stripping comprises exposing the photoresist to an ozone-containing gaseous atmosphere while heating the substrate on which the photoresist layer is disposed. This method is disclosed in U.S. Pat. No. 4,431,592 wherein the ozone is transported across the photoresist in a reaction chamber while the substrate is heated to a temperature not to exceed 250° C.

While photoresist stripping techniques using ozone were initially promising in that they are clean and convenient to work with and result in fewer problems with surface contamination and electrical damage that other methods, they did not meet with commercial success in that they were two slow for most resists.

In Ury et al U.S. Pat. No. 4,885,047, which is incorporated herein by reference, a photoresist stripping method using ozone which achieved substantially higher stripping rates was disclosed. The higher stripping rates are achieved by passing the ozone over the photoresist through a narrow gap, while the resist is held at an elevated temperature.

In the apparatus disclosed in U.S. Pat. No. 4,885,047 (FIG. 1), an oxidizing gas such as a mixture of ozone and oxygen is introduced at a port central to the wafer. The gas flows radially in a narrow gap defined by the wafer and a quartz plate to the wafer edge. As the gas flows over the wafer the photoresist is oxidized and thereby removed.

In the system of the prior patent it has been found than in order to supply a sufficient quantity of ozone to conduct the ashing process at the required speed, the gas must be introduced at a velocity such that the portion of wafer underlying the gas jet is cooled. The cooling results in lesser conversion of ozone to atomic oxygen and so slows the ashing rate especially in the vicinity of the jet. The foregoing phenomenon is manifested by a dip in the plot of ashing rate versus radial position at the center of the wafer.

Additionally, the treatment gas is used up, i.e., the concentration of atomic oxygen, oxygen, and ozone decreases, as the gas flows over the wafer surface. Since the gas is introduced at the center of the wafer, the photoresist at the edge which, as discussed above, requires the most reaction to remove, is subject to the least potent gas.

It is thus an object of the present invention to provide a photoresist removal method and apparatus which clears a wafer of resist quickly.

It is a further object of the invention to provide a method and apparatus for removing photoresist from a wafer which may provide resist removal rates at each part of the wafer commensurate with the thickness of resist borne by that part.

It is still a further object of the invention to provide a resist removal method and apparatus which is capable of rapidly removing resists which have been subject to ion implantation and plasma treatments.

In accordance with the invention, the above objects are accomplished by providing an apparatus wherein there is a space above the photoresist having both a peripheral area which encompasses the periphery of the space, and a central area. The oxidizing gas is introduced at the peripheral area of the space, near which the edge of the wafer is located. The gas is caused to flow from the edge to the center of the wafer, where it is exhausted. As the treatment gas flows over the surface of the wafer, resist which is coated on the surface reacts with the treatment gas and is thereby removed.

Ozone may be used as the treatment gas. The ozone gas may be directed into the treatment chamber and at the heated wafer support platform just outside the area occupied by the wafer, so that the ozone contacts the heated platform before the wafer. On contacting the heated platform, ozone is converted into atomic oxygen and oxygen. The gas reaching the wafer will thus have a greater amount of atomic oxygen and will therefore oxidize the resist faster.

The treatment gas entering the treatment chamber near the edge of the wafer may be directed so that it impinges on the bead of resist on the wafer edge. In this way the bead of resist which is difficult to remove is subject to a supply of fresh treatment gas. Since the supply of treatment gas is not restricted to a central port it is not necessary to make the velocity of the entering gas stream so high that it would cool the wafer and slow the treatment reaction.

BRIEF DESCRIPTION OF THE FIGURES

FIG. 3 shows the photoresist removal apparatus having both portions.

DETAILED DESCRIPTION OF PREFERRED EMBODIMENT

Figure 1:
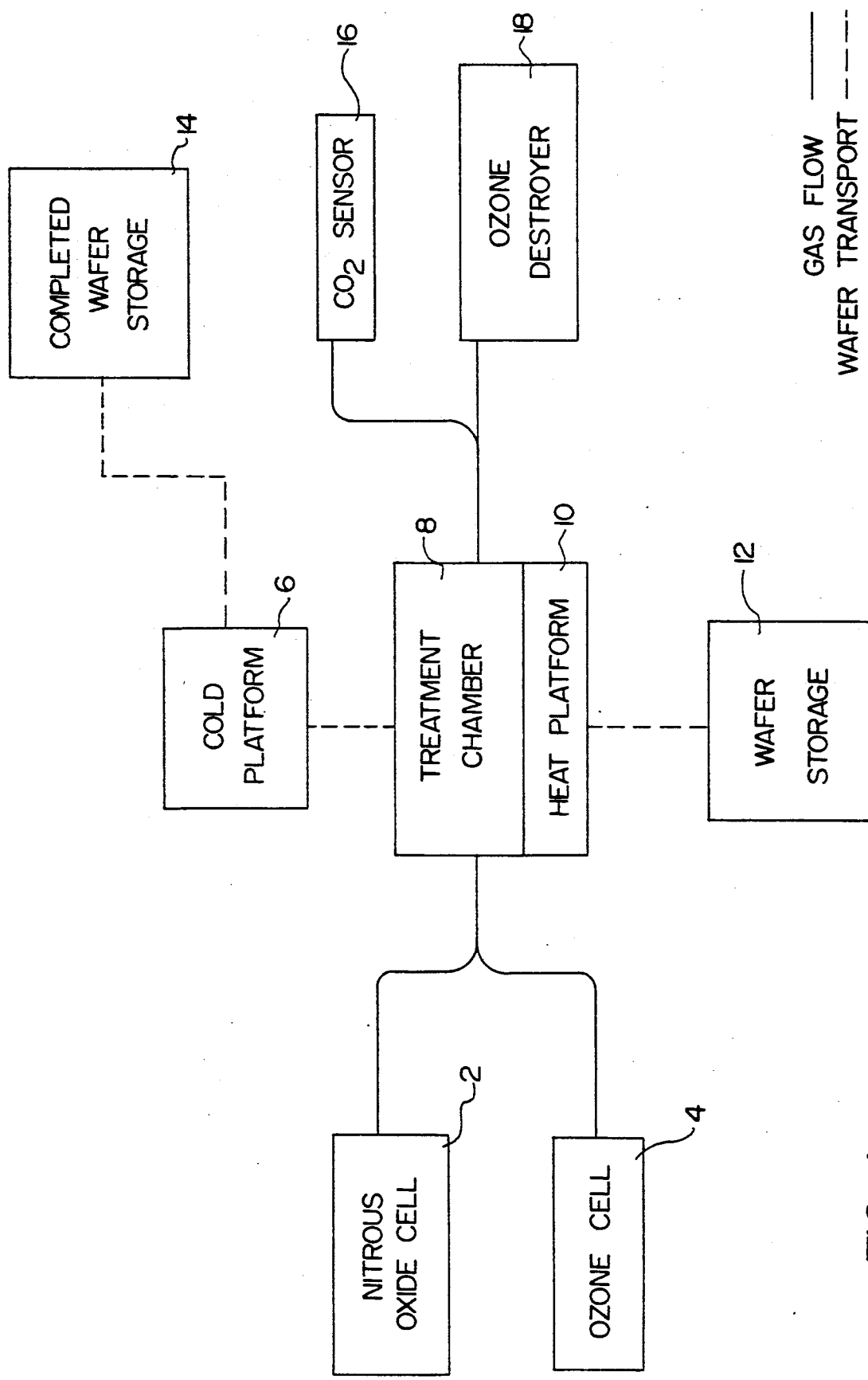
FIG. 1 is a block diagram of a photoresist removal apparatus which uses an oxidizing fluid.

Referring to FIG. 1, a block diagram of an asher which uses an oxidizing fluid is depicted. Ozone producing cell 4 outputs ozone, while nitrous oxide producing cell 2 outputs nitrous oxide. This gas flows into treatment chamber 8 which includes a heated wafer holding platform 10 as described below. In general, the chamber is designed to apply heat and oxidant to the semiconductor wafer.

A wafer storage device 12 sometimes termed a boat retains wafers on the chassis of the asher prior to treatment. Wafers are moved from the wafer storage device to the treatment chamber by robotics. Upon removal from the wafer chamber the wafers are placed on a cold platform 6 so as to shorten the time that it takes the wafer to cool, so that placement of the resist in a plastic storage means is not delayed. After a period the wafer is removed from the cold platform and placed in the above-mentioned storage device 14.

After the gas is used in the chamber most of it is fed through an ozone destroyer 18 which causes all singlet and ozone in the mixture to be converted to relatively inert oxygen. Additionally, a small amount of the gas exiting the chamber is conducted to a carbon dioxide sensor 16, as the amount of carbon dioxide in the gas stream reflects how much resist is being oxidized.

Figure 2:
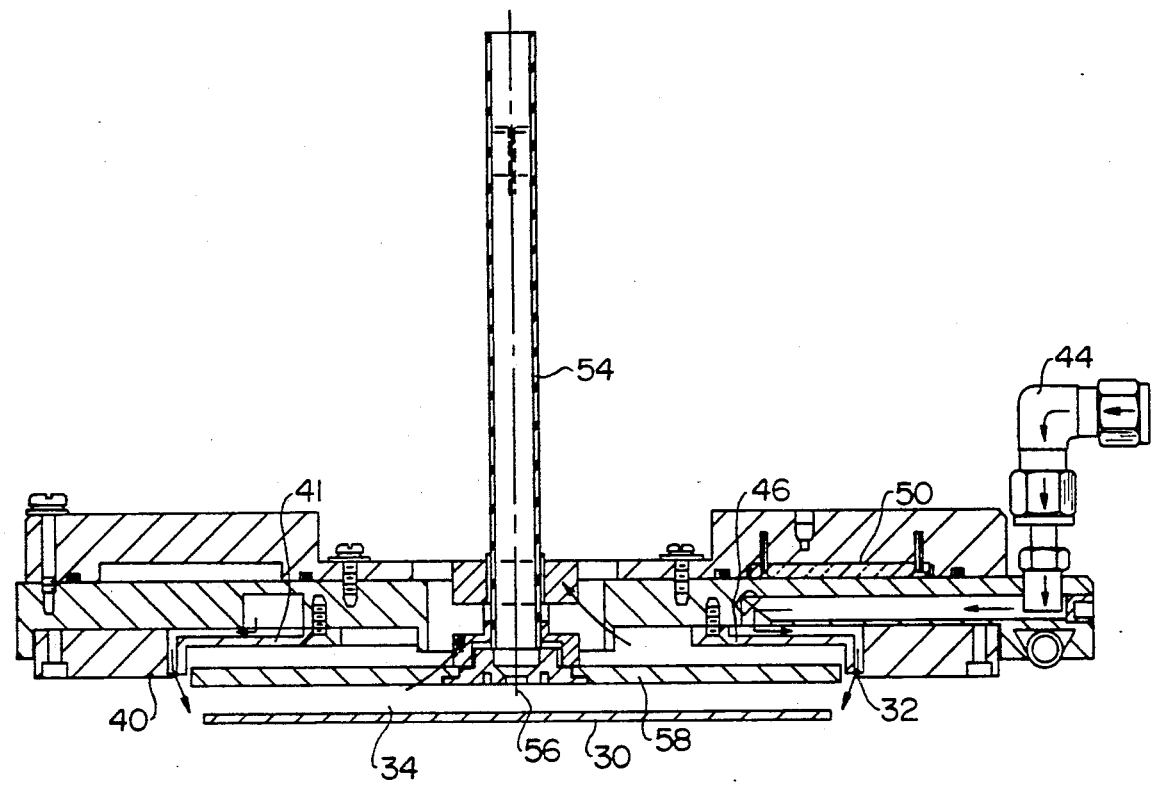
FIG. 2 shows a cross section of one portion of a photoresist removal apparatus in accordance with an embodiment of the invention.
Figure 3:
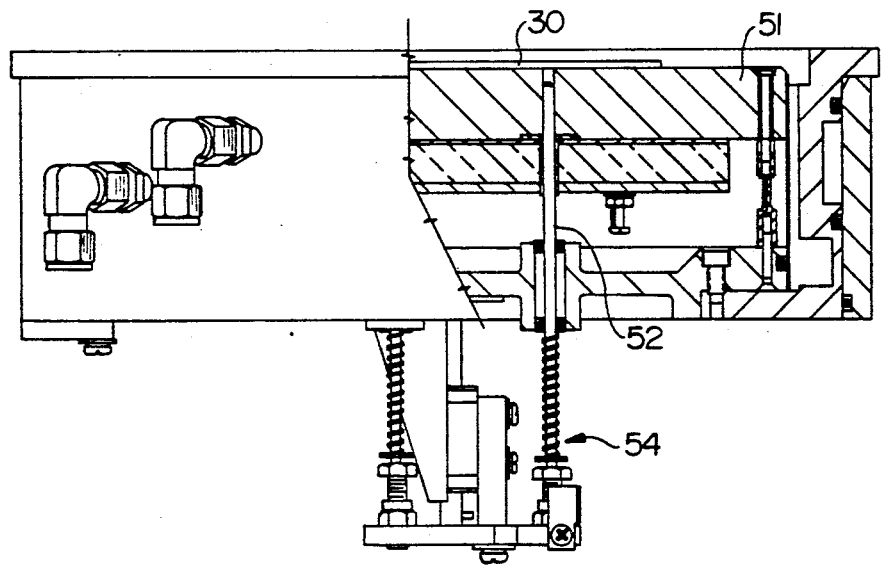
FIG. 3 shows the other portion of a photoresist removal apparatus partly in cross section in accordance with an embodiment of the invention.
Figure 4:
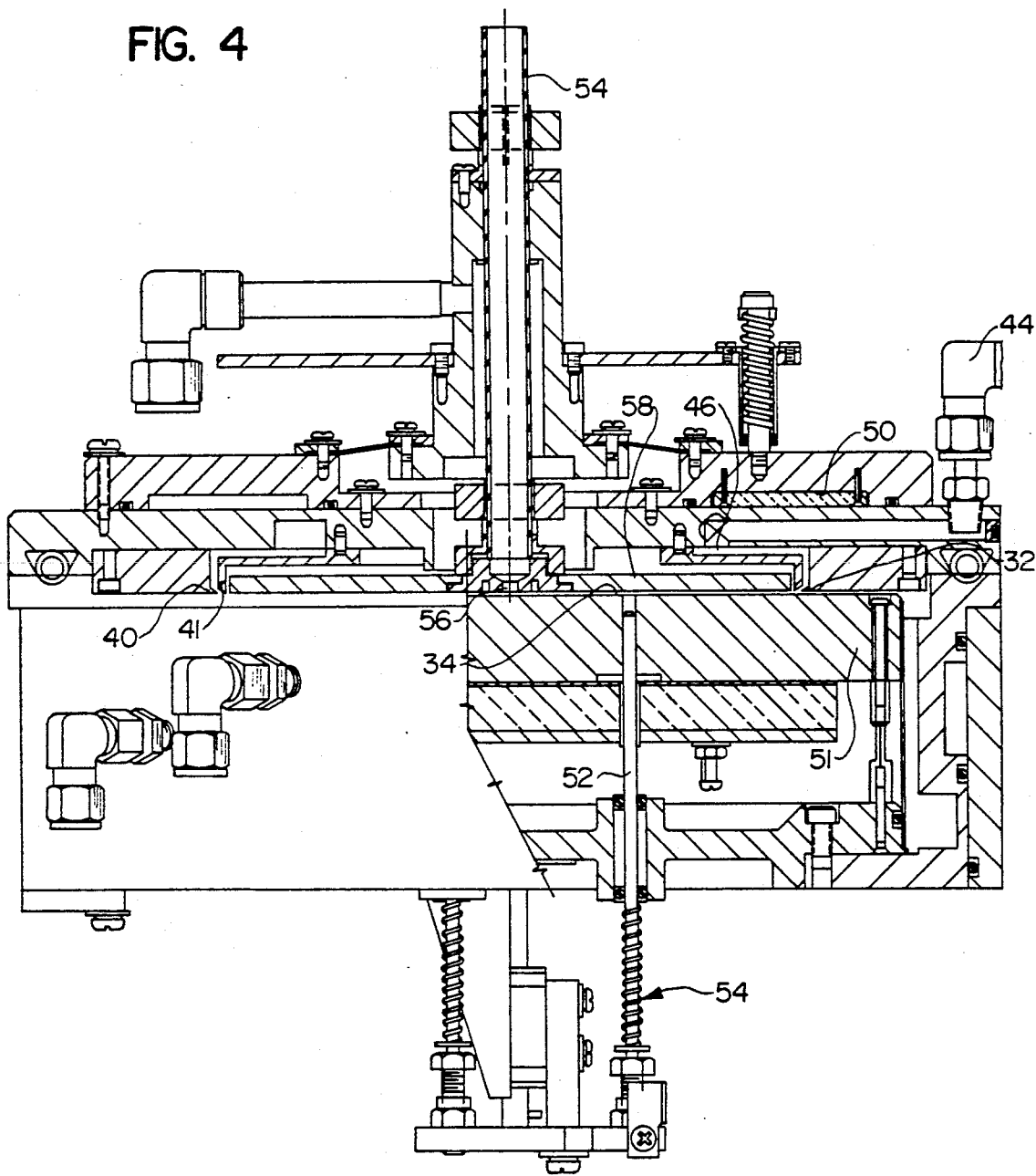

FIGS. 2 to 4 show a process chamber in accordance with an embodiment of the invention. FIG. 2 shows a portion of the chamber, FIG. 3 shows a further portion, and FIG. 4 shows the two portions in working relationship.

Referring to FIG. 2, it is desired to pass oxidizing gas through space 34 over semiconductor wafer 30 from the edge of the wafer towards the center. Space 34 has a peripheral area which encompasses the periphery of the space (adjacent the wafer edge), and a central area. An annular orifice 32 is provided, and the gas is fed through the orifice to the peripheral area of space 34. The annular orifice may be of such diameter and angular disposition that the gas is directed so that it impinges the heated platform (FIG. 3) just beyond the edge o the wafer and is then directed at the resist bead or the edge of the wafer and in turn towards the center of the wafer. The annular orifice 32 is defined by an outer distribution plate 40 and an inner distribution plate 41. The distribution plates 40, 41 may be exchanged for those of different sizes so that different size wafers can be accommodated. Additionally, the angular orientation of the orifice may be changed in those instances where it is desirable to impinge the edge of the wafer directly without first impinging the heated platform. Treatment gas enters the treatment chamber through a gas fitting 44. It flows around an annular distribution ring 46 and then through the annular orifice 32.

Instead of an annular orifice, the chamber may have a plurality of local orifices which are disposed in an annular ring around the chamber. Thus, the annular distribution ring 46 may be as shown, but instead of opening into an annular orifice, may open into a plurality of discrete, local orifices.

A water cooling jacket 50 is provided, which prevents the treatment gas from being prematurely heated as it is conducted about the annular distribution ring. It is important that the treatment gas not be heated too early, as otherwise the ozone will be decomposed into singlet oxygen and oxygen, and then the atomic oxygen will combine to form relatively inert oxygen before reaching the photoresist.

In the central area of space 34 is the treatment gas outlet conduit 54. After the gas moves across the wafer it flows into orifice 56 which is at the mouth of conduit 54. Quartz plate 58 is secured to the bottom of the chamber portion shown in FIG. 2, and along with the wafer defines a narrow gap over through which the treatment gases flow as they react with the photoresist.

Referring next to FIG. 3, the other part of the treatment chamber is shown. The wafer 30 is held on a wafer support platform 50, which is heated, for example by a resistance heater. The wafer support platform may be operated at temperatures up to above 300° C., high temperature being desirable to optimize the process. The wafer support platform is supported on flexible support rods 52, and lift mechanism 54 is arranged to raise and lower the platform via support rods 52. Cooling water is circulated in jacket 58 to effect cooling of the unit.

FIG. 4 depicts the two portions of the treatment chamber in operative relationship. In an actual asher system, the bottom portion would be mounted on a chassis, while the top portion would be connected to a power mechanism for lifting and lowering it on to the bottom portion each time a new wafer is inserted in the chamber for processing.

In the operation of the unit, after a wafer is inserted and the top portion is lowered so as to create a gap between the wafer and quartz plate 58, oxidizing gas is fed to inlet 44. It flows to annular distribution ring 46, and out annular orifice 32 to the heated platform 50 and the edge of the wafer (not shown), then across the wafer to centrally located outlet orifice 56. Thus, the edge of the wafer, where the above-discussed difficult to strip resist bead is located is impinged with fresh, uncontaminated, and just heated oxidizing gas, so as to enhance the stripping rate. Additionally, since the incoming oxidizing gas is distributed around an annular orifice, or a plurality of orifices, the flow rate is not to great as to result in cooling, as when the oxidizing gas enters at a single, centrally located orifice.

EXAMPLE 1

A six-inch semiconductor wafer was coated with a nominal 2 micron layer of KTI 820 photoresist, which was applied by spin coating, and therefore resulted in a typical thickened portion of resist at the edge. The resist was then subjected to ultraviolet light and heat in order to harden it as would be done in the course of regular manufacturing. The resist coated wafer prepared as described above was treated in an asher as shown in FIG. 1 of the above-mentioned U.S. Pat. No. 4,885,047, having a centrally located inlet for the oxidizing gas. The flow of process gases consisted of 14.5-15 slm of ozone oxygen mixture and 0.20 slm of excited nitrous oxide. The wafer was supported on a heated platform and heated to a temperature of 315° C. Optical microscope inspection was used to determine when the resist was completely removed from the wafer including the edge and bevel. The wafer was cleared in one hundred fifty eight (158) seconds.

EXAMPLE 2

A resist coated wafer, prepared as described in Example 1 was treated in a working prototype embodying the present invention. The process gas was fed in at the edge and withdrawn at the center. The same process gas flow and heating given in Example 1 were used. The wafer was cleared in sixty five (65) seconds.

It should be appreciated that while the invention has been disclosed in connection with an illustrative embodiment, variations will occur to those skilled in the art, and its scope is to be limited only by the claims appended hereto as well as equivalents.

I claim:

1. A method of stripping a layer of photoresist from a substrate, wherein the substrate is placed on a heated surface and oxidizing fluid is passed through a space over the photoresist layer, comprising the steps of,
   providing a heated surface on which said substrate is placed,
   providing a second surface which is separated from said heated surface so as to form a space therebetween, said space having a peripheral area which encompasses the periphery of the space, and a central area,
   feeding said oxidizing fluid to the peripheral area of said space, and
   removing said oxidizing fluid at said central area of said space, whereby a flow of said oxidizing fluid through said space and over said photoresist layer from the peripheral area of the space to the central area is established.

2. The method of claim 1 wherein when said oxidizing fluid is fed to the peripheral area of said space, it is directed so as to come in contact with said heated surface before contacting said photoresist layer.

3. The method of claim 1 wherein said space comprises a narrow gap.

4. The method of claim 2 wherein said space comprises a narrow gap.

* * * * *